(12) United States Patent
Sugimoto et al.

(10) Patent No.: US 6,747,466 B2
(45) Date of Patent: Jun. 8, 2004

(54) SUBSTRATE TESTING APPARATUS AND SUBSTRATE TESTING METHOD

(75) Inventors: Hiromitsu Sugimoto, Hyogo (JP); Tsuyoshi Kanao, Hyogo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 09/987,893

(22) Filed: Nov. 16, 2001

(65) Prior Publication Data

US 2002/0190736 A1 Dec. 19, 2002

(30) Foreign Application Priority Data

Jun. 12, 2001 (JP) ........................................ 2001-177396

(51) Int. Cl.[7] .............................................. G01R 31/02
(52) U.S. Cl. ...................................... 324/754; 324/761
(58) Field of Search ................................. 324/754, 755, 324/756, 757, 758, 761–762, 158.1, 73.1; 439/482

(56) References Cited

U.S. PATENT DOCUMENTS 6,137,303 A * 10/2000 Deckert et al. ............. 324/765
6,201,402 B1 * 3/2001 Root ........................... 324/754
6,259,261 B1 * 7/2001 Engelking et al. .......... 324/754
6,384,734 B1 * 5/2002 Ohno et al. ................. 340/679

FOREIGN PATENT DOCUMENTS

| JP | 4-326540 | 11/1992 |
|---|---|---|
| JP | 5-297020 | 11/1993 |
| JP | 11-307599 | 11/1999 |

* cited by examiner

Primary Examiner—Evan Pert
Assistant Examiner—Tung X. Nguyen
(74) Attorney, Agent, or Firm—McDermott, Will & Emery

(57) ABSTRACT

A substrate testing apparatus includes a first rail group made of a plurality of rails disposed in parallel with each other, a second rail group made of a plurality of rails disposed in parallel with each other in a direction that crosses the first rail group, a plurality of probe units disposed to cover respective intersections of the rails included in the first rail group and the rails included in the second rail group and being movable along the rails included in the first rail group and the second rail group, and corresponding interval maintaining means for keeping each rail included in the first rail group at an interval corresponding to an arrangement of locations to be measured on a substrate subjected to measurement, wherein the plurality of probe units each include a probing needle to be brought into contact with a surface of the substrate.

6 Claims, 9 Drawing Sheets

SUBSTRATE TESTING APPARATUS AND SUBSTRATE TESTING METHOD

BACKGROUND OF THE INVENTION

1. Field of the Invention

The present invention relates to a substrate testing apparatus and a substrate testing method for testing the surface of a semiconductor wafer or the like.

2. Description of the Background Art

Hitherto, in order to carry out the testing of the surface of a semiconductor wafer such as a silicon wafer at plural locations collectively and efficiently, there has been a method of allowing a probe card 26 to abut against a semiconductor wafer 18 from above, as shown in FIG. 11. A substrate testing apparatus based on the prior art is provided with such a probe card 26, where a probing needle 27 is fixed onto the lower surface of probe card 26 with its tip end pointing downwards. On the semiconductor wafer 18 side, the locations against which probing needle 27 is allowed to abut (hereafter referred to as "abutment points") are inherently defined by formation of pads or wirings on the surface. Plural probing needles 27 are arranged in such a manner as to correspond to the plural abutment points on the semiconductor wafer 18 surface, respectively. In order to carry out simultaneous testing of the entire surface of semiconductor wafer 18, one makes use of a probe card 26 having a size approximately equal to that of semiconductor wafer 18.

The semiconductor wafers are exposed to various temperature environments due to circumstances of the process for producing semiconductor devices. The semiconductor wafers themselves expand or contract depending on the temperature at each time. When the temperature of semiconductor wafer 18 changes to expand or contract semiconductor wafer 18, the positional relationship among the abutment points on the semiconductor wafer side is also enlarged or diminished.

In the case of a substrate testing apparatus where probing needle 27 is fixed to probe card 26, if a semiconductor wafer expands or contracts to change the arrangement of abutment points, the interval between probing needles 27 will not accord with the interval between the abutment points, thereby raising a possibility that the testing cannot be carried out normally. From now on, according as the semiconductor wafers increase in size and individual elements on the semiconductor wafer surface decrease in size, the thermal expansion/contraction will have a larger influence and the aforesaid problem will be more serious.

Thus, an object of the present invention is to provide a substrate testing apparatus and a substrate testing method capable of performing a collective testing over a wide area of the substrate surface even under different temperature environments by adjusting the interval between the probing needles in accordance with the expansion/contraction of the substrate such as a semiconductor wafer.

SUMMARY OF THE INVENTION

In order to achieve the aforementioned object, a substrate testing apparatus according to one aspect of the present invention includes a first rail, a second rail that crosses the first rail, and a probe unit disposed to cover an intersection of the first and second rails and being respectively movable along the first and second rails, wherein the probe unit includes a probing needle that is brought into contact with a surface of a substrate subjected to measurement. By adopting this construction, one can suitably change the relative positional relationship of the probing needle by moving the probe unit along the rails. Therefore, a substrate testing apparatus can be provided that can accord with the change of abutment points due to expansion/contraction of the substrate.

Further, in order to achieve the aforementioned object, a substrate testing apparatus according to another aspect of the present invention includes a first rail group made of a plurality of rails disposed in parallel with each other, a second rail group made of a plurality of rails disposed in parallel with each other in a direction that crosses the first rail group, a plurality of probe units disposed to cover respective intersections of the rails included in the first rail group and the rails included in the second rail group and being movable along the rails included in the first rail group and the second rail group, and corresponding interval maintaining means for keeping each rail included in the first rail group at an interval corresponding to an arrangement of locations to be measured on a substrate subjected to measurement, wherein the plurality of probe units each include a probing needle to be brought into contact with a surface of the substrate. By adopting this construction, one can suitably change the relative positional relationship of the probing needles by moving the plurality of probe units all at a time along the rails even if the measurement is to be conducted at plural sites. Therefore, a substrate testing apparatus can be provided that can accord with the change of abutment points due to expansion/contraction of the substrate.

In the above-described invention, the corresponding interval maintaining means preferably maintains the interval after changing the interval every time the arrangement of the locations to be measured changes. By adopting this construction, one can test the substrate without bringing the probing needles into contact with the parts of the substrate subjected to measurement where the probing needles should not be brought into contact. This eliminates the fear of undesirably damaging the substrate with the probing needles.

In the above-described invention, the corresponding interval maintaining means preferably includes equal interval maintaining means for keeping each rail included in the first rail group at an equal interval. By adopting this construction, one can move the plurality of rails while keeping the rails at an equal interval, so that the plurality of probe units mounted on these rails are also moved all at a time while the interval thereof is kept equal, making it possible to appropriately change the relative positional relationship of the probing needles. Therefore, a substrate testing apparatus can be provided that can accord with the change of abutment points due to expansion/contraction of the substrate.

In the above-described invention, the substrate testing apparatus further includes displacement measuring means for measuring a displacement of one or more observation points on the substrate subjected to measurement, and displacement measurement value feedback means for setting the interval of each rail included in the first rail group, as defined by the equal interval maintaining means, in accordance with a displacement measurement value given by the displacement measuring means. By adopting this construction, one can quantitatively sense the amount of expansion/contraction of the substrate subjected to measurement with the use of displacement measuring means, and can change the interval of rails to accord with the arrangement of the abutment points after the expansion/contraction with the use of displacement measurement value feedback means.

In the above-described invention, the substrate testing apparatus further includes temperature measuring means for measuring a temperature, and temperature measurement value feedback means for setting the interval of each rail included in the first rail group, as defined by the equal interval maintaining means, in accordance with a temperature measurement value given by the temperature measuring means. By adopting this construction, one can quantitatively sense the amount of thermal expansion/contraction of the substrate subjected to measurement on the basis of the data retained in advance. When the amount of expansion/contraction is obtained, one can change the interval of rails to accord with the arrangement of the abutment points after the expansion/contraction with the use of temperature measurement value feedback means.

In order to achieve the aforementioned object, a substrate testing method according to the present invention uses a plurality of probe units disposed to cover respective intersections of rails included in a first rail group made of a plurality of rails disposed in parallel with each other and rails included in a second rail group made of a plurality of rails disposed in parallel with each other in a direction that crosses the first rail group, the plurality of probe units being movable along the rails included in the first rail group and the second rail group and each including a probing needle to be brought into contact with a surface of a substrate subjected to measurement, wherein the probing needles are brought into contact with the substrate in a state in which an arrangement of the plurality of probe units is adjusted so that an interval between the probing needles corresponds to an arrangement of locations to be measured on the substrate. By adopting this method, one can test the substrate without bringing the probing needles into contact with the parts of the substrate subjected to measurement where the probing needles should not be brought into contact. This eliminates the fear of undesirably damaging the substrate with the probing needles. Since the interval of the probe units can be freely changed along the rails, one can easily accord with the change in the arrangement of circuit patterns or the like subjected to measurement.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
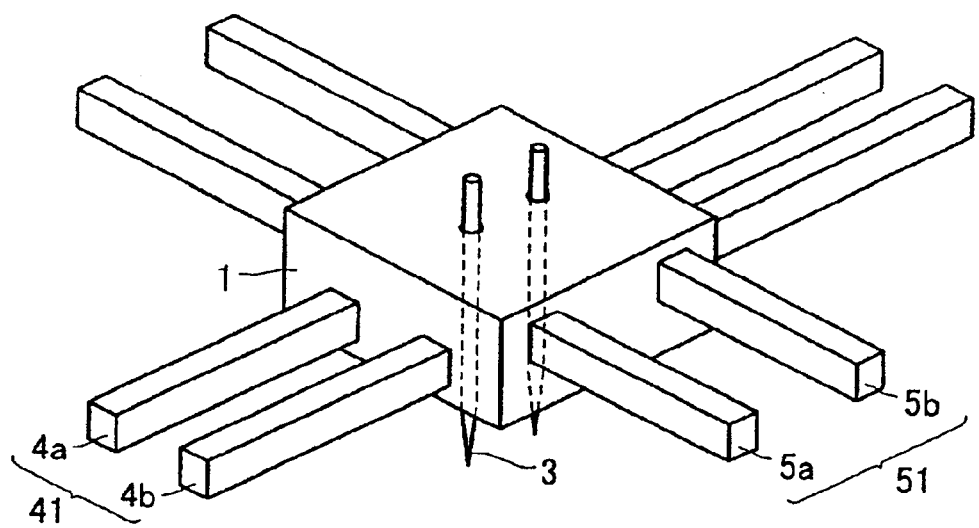
FIG. 1 is a perspective view illustrating a substrate testing apparatus according to a first embodiment of the present invention.

Referring to FIG. 1, a substrate testing apparatus according to the first embodiment of the present invention will be described. This substrate testing apparatus is provided with rails 41, 51 that cross each other in a lattice-like configuration, and is provided with a probe unit 1 disposed to cover the intersection of rails 41, 51. The rail 41 may be made of one rail; however, it is assumed here that the rail 41 is made of two rail elements 4a, 4b. Also, the rail 51 is made of two rail elements 5a, 5b in the same manner. Probe unit 1 is provided with a probing needle 3 that is brought into contact with the substrate subjected to measurement. In FIG. 1, probing needle 3 is illustrated as being made of two needles; however, probing needle 3 disposed in one probe unit 1 may include one needle or any number of needles. Probe unit 1 is adapted to be capable of moving respectively along rails 41, 51.

According to a substrate testing apparatus provided with such a probe unit, one can suitably change the relative positional relationship of the probing needle by moving the probe unit along the rails. Therefore, a substrate testing apparatus can be provided that can accord with the change of abutment points due to expansion/contraction of the substrate.

(Second Embodiment)

Figure 2:
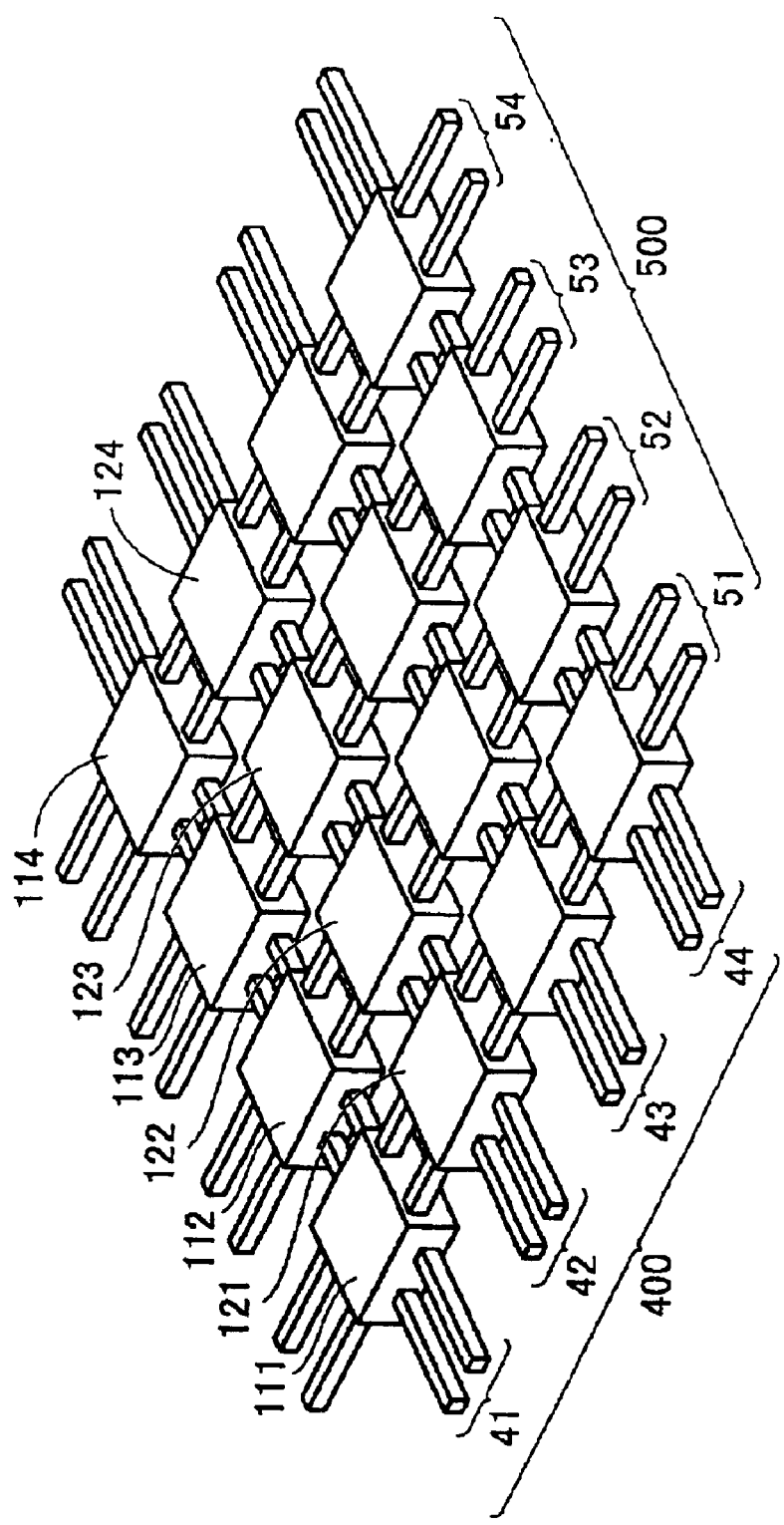
FIG. 2 is a perspective view illustrating a substrate testing apparatus according to a second embodiment of the present invention.

Referring to FIG. 2, a substrate testing apparatus according to the second embodiment of the present invention will be described. This substrate testing apparatus is provided with a plurality of probe units as described referring to FIG. 1, and is provided with rail groups 400, 500 that cross each other in a lattice-like configuration. Rail group 400 is a rail group made of rails 41, 42, 43, 44 disposed in parallel with each other, and rail group 500 is a rail group made of rails 51, 52, 53, 54 disposed in parallel with each other. Probe units 111, 112, 113, 114, 121, 122, 123, 124, and others are disposed in a checkerboard-like configuration so as to cover the respective intersections of the rail group 400 and rail group 500, and each probe unit is movable along the rails.

Figure 3:
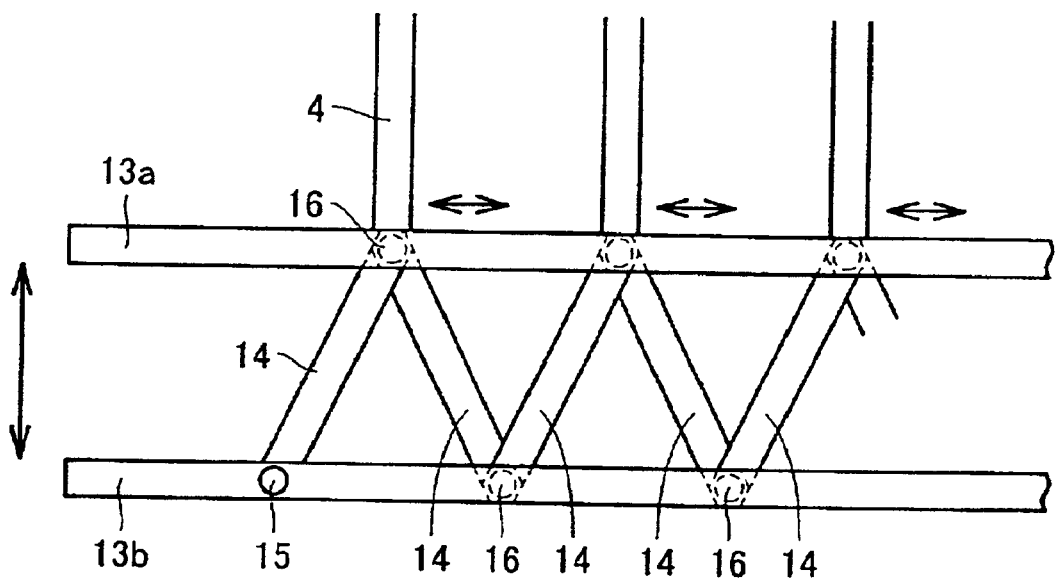
FIG. 3 is an explanatory view illustrating a mechanism provided by the substrate testing apparatus according to the second embodiment of the present invention.

At each end of rail groups 400, 500, there is provided a mechanism such as shown in FIG. 3, as equal interval maintaining means. The mechanism shown in FIG. 3 is shown as being directed to rails 4 that are parallel with each other; however, it is a mechanism for keeping rails 4 at an equal interval. This mechanism includes members 13a, 13b that are parallel with each other, and members 14 are mounted in a zigzag manner onto members 13a, 13b. One end of one of members 14 is fixed to member 13b at a fulcrum 15. The other end of the member 14 is fixed to member 13a by a fulcrum 16. Further, referring to FIG. 3, both ends of other members 14 are alternately fixed to members 13a, 13b respectively by fulcrums 16. Fulcrum 15 is rotatable but is not slidable, while fulcrum 16 is both rotatable and slidable. By using such a mechanism as equal interval maintaining means, rail groups 400, 500 can be respectively kept at an equal interval. FIG. 3 shows an example in which the mechanism is connected to rails 4; however, one can connect the mechanism to rail group 400 if one replaces each rail 4 respectively with rail 41, 42, 43, 44 or the like. The same applies to rail group 500 as well. Here, an example has been given in which equal interval maintaining means is disposed in both of rail groups 400, 500 that cross each other; however, one may dispose equal interval maintaining means only in one of rail groups 400, 500 that cross each other in accordance with the needs.

By adopting the above-mentioned construction, one can allow the following movement. For example, when rail 41 is translated in a state of being perpendicular to rail group 500, probe units 111, 112, 113, 114 are translated all at a time. When the interval between rails 41 and 42 is changed, the rails in rail group 400 are moved along rail group 500 while being kept parallel and equally spaced. The same applies to moving the rails in rail group 500 along rail group 400.

Since the respective intervals of rail groups 400, 500 that cross each other can be changed in such a manner, the interval between the probe units can be changed in accordance with the thermal expansion/contraction of the substrate subjected to measurement. Thus, since the interval between the probing needles can be changed in this substrate testing apparatus, one can perform a collective testing over a wide area of the substrate surface even under different temperature environments.

Here, an example has been shown in which the rails are maintained at an equal interval by using equal interval maintaining means; however, if the abutment points are not arranged at an equal interval, the interval may not be equal but may be an interval that accords with the arrangement of the abutment points.

(Third Embodiment)

Figure 4:
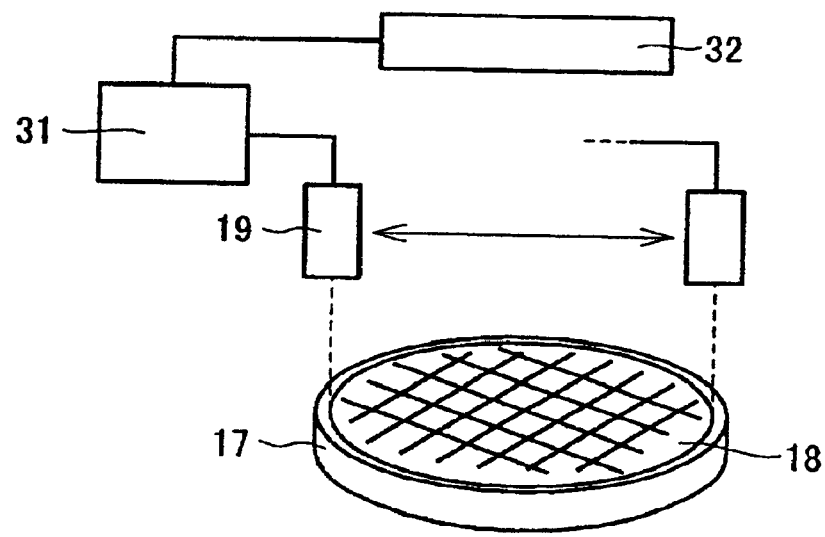
FIG. 4 is a conceptual view illustrating a substrate testing apparatus according to a third embodiment of the present invention.

Referring to FIG. 4, a substrate testing apparatus according to the third embodiment of the present invention will be described. Referring to FIG. 4, this substrate testing apparatus is provided with a main body 31, a card part 32 made of a lattice-like structure such as shown in FIG. 2, and a camera 19 as displacement measuring means. Camera 19 observes the surface or the edge points of a semiconductor wafer 18 as a substrate subjected to measurement, and camera 19 may be moved to cross over semiconductor wafer 18 as shown in FIG. 4. Main body 31 is provided with displacement measurement value feedback means for adjusting the interval of rails in card part 32 in accordance with the result of observation by camera 19.

By providing camera 19 as such displacement measuring means, one can observe the points on semiconductor wafer 18 to sense how much the points are displaced. By this construction, one can quantitatively sense the amount of thermal expansion/contraction of semiconductor wafer 18. When the amount of expansion/contraction is obtained, one can change the interval of rails in card part 32 to accord with the arrangement of the abutment points after the expansion/contraction by using displacement measurement value feedback means.

Here, the displacement measuring means is not limited to a camera, but may be any other device such as a laser or a length-measuring gauge as long as it can measure the displacement of points. Further, the displacement measurement value feedback means may incorporate, for example, a computer for performing a control.

(Fourth Embodiment)

Figure 5:
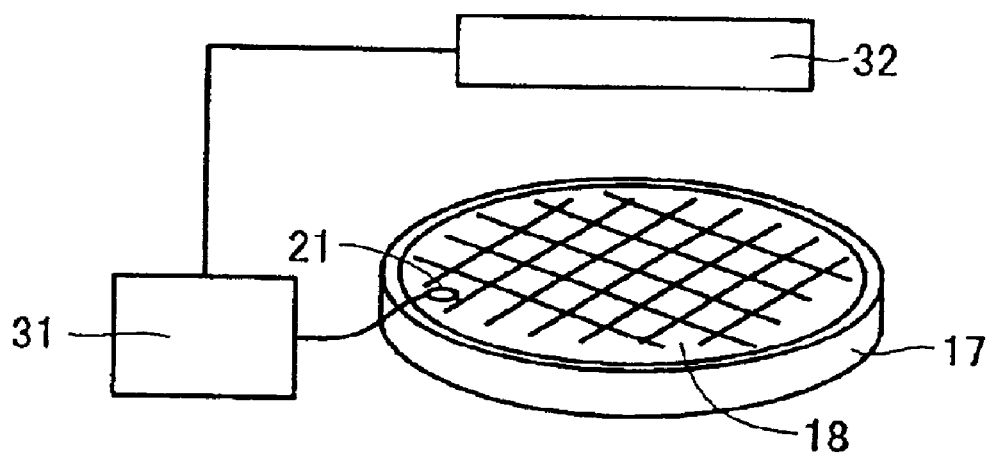
FIG. 5 is a conceptual view illustrating a substrate testing apparatus according to a fourth embodiment of the present invention.

Referring to FIG. 5, a substrate testing apparatus according to the fourth embodiment of the present invention will be described. Referring to FIG. 5, this substrate testing apparatus is provided with a main body 31, a card part 32 made of a lattice-like structure such as shown in FIG. 2, and a temperature sensor 21 as temperature measuring means. Temperature sensor 21 observes the temperature of a semiconductor wafer 18 as a substrate subjected to measurement. Main body 31 retains data on the thermal expansion of semiconductor wafer 18, and can deduce the amount of elongation corresponding to each temperature. Main body 31 is provided with temperature measurement value feedback means for adjusting the interval of rails in card part 32 in accordance with the result of observation by temperature sensor 21.

Here, the measurement by temperature sensor 21 may be carried out by measuring the temperature of a wafer chuck 17. Further, temperature sensor 21 may measure the temperature therearound.

By providing temperature sensor 21 as such temperature measuring means, one can quantitatively sense the amount of thermal expansion/contraction of semiconductor wafer 18 on the basis of the data retained in advance. When the amount of expansion/contraction is obtained, one can change the interval of rails in card part 32 to accord with the arrangement of the abutment points after the expansion/contraction by using temperature measurement value feedback means.

(Fifth Embodiment)

Figure 6:
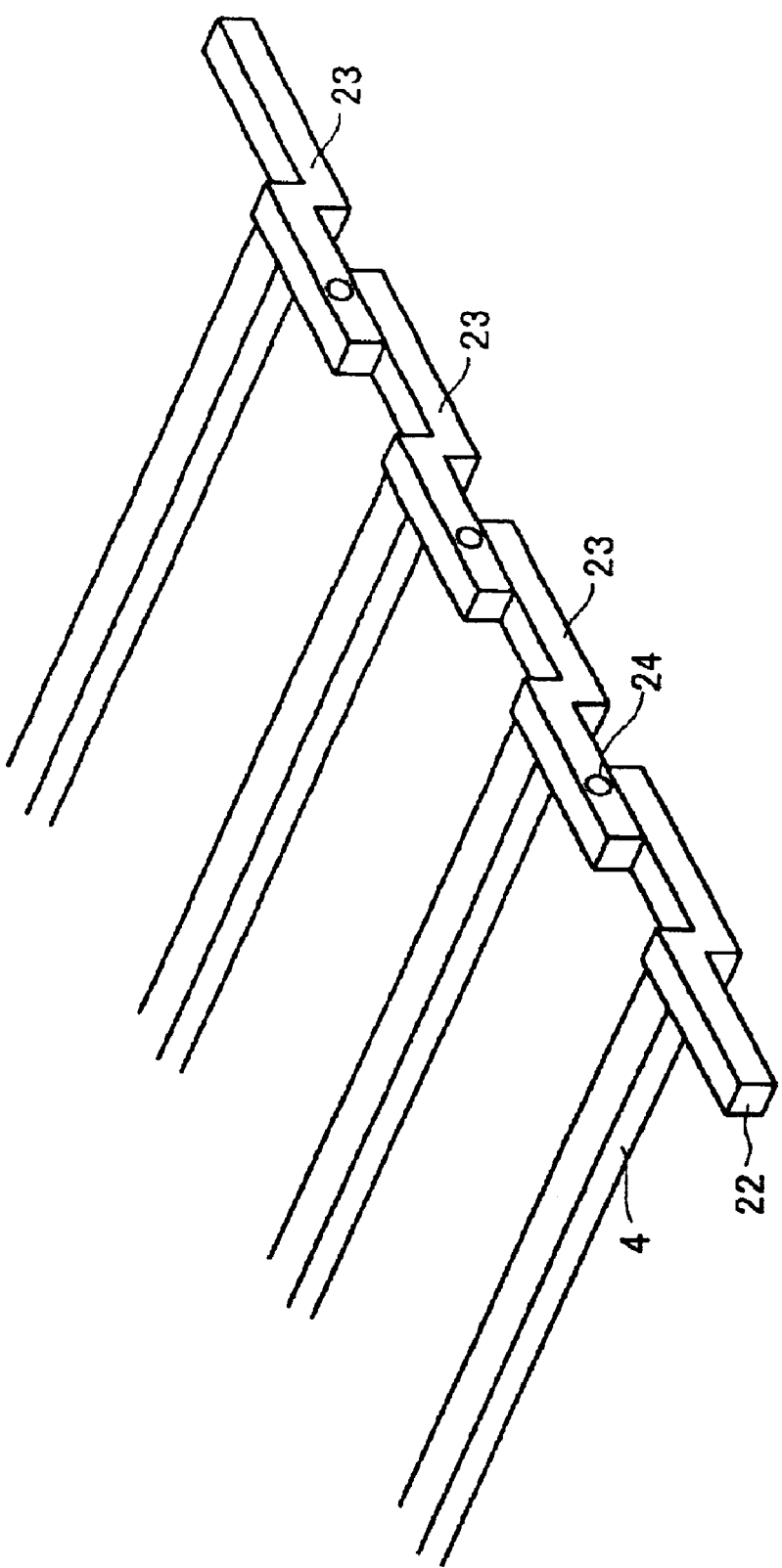
FIG. 6 is a perspective view illustrating a mechanism provided by the substrate testing apparatus according to a fifth embodiment of the present invention.

Referring to FIG. 6, a substrate testing apparatus according to the fifth embodiment of the present invention will be described. This substrate testing apparatus is similar to that of the second embodiment but is provided with a mechanism in which a rail fixing jig 22 and rail moving jigs 23 are successively superposed and combined, as shown in FIG. 6, instead of the mechanism shown in FIG. 3. Rail moving jigs 23 are each provided with a gear 24 which can be driven from outside, and the interval between rails 4 can be adjusted by driving the gear 24.

Since the interval between the rails can be changed with gears 24, the interval between probe units can be changed in accordance with the thermal expansion/contraction of the substrate subjected to measurement. Therefore, since the interval between the probing needles can be changed in this substrate testing apparatus, one can perform a collective testing over a wide area of the substrate surface even under different temperature environments.

(Sixth Embodiment)

Figure 7:
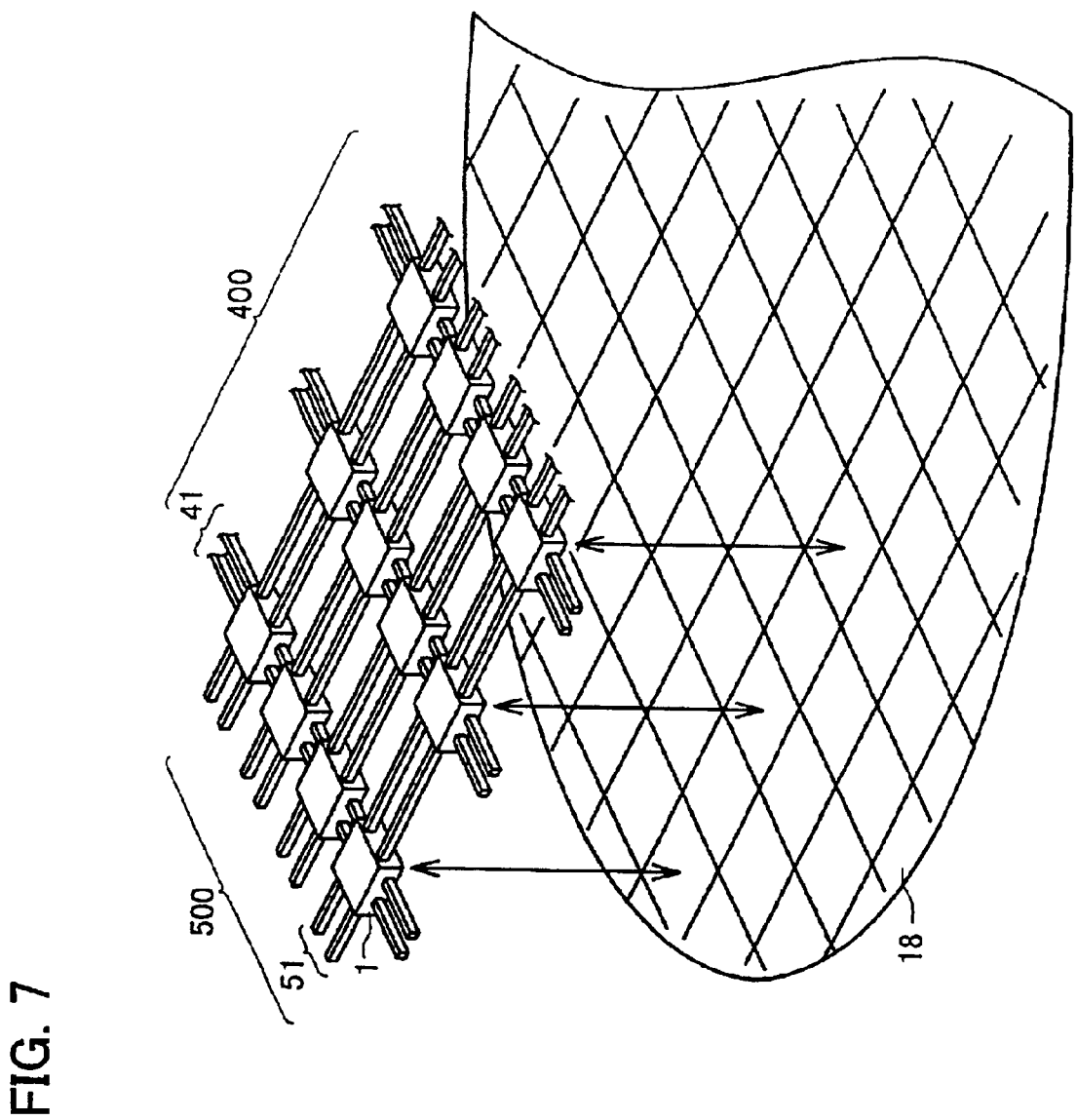
FIG. 7 is a first explanatory view illustrating a substrate testing method according to a sixth embodiment of the present invention.
Figure 8:
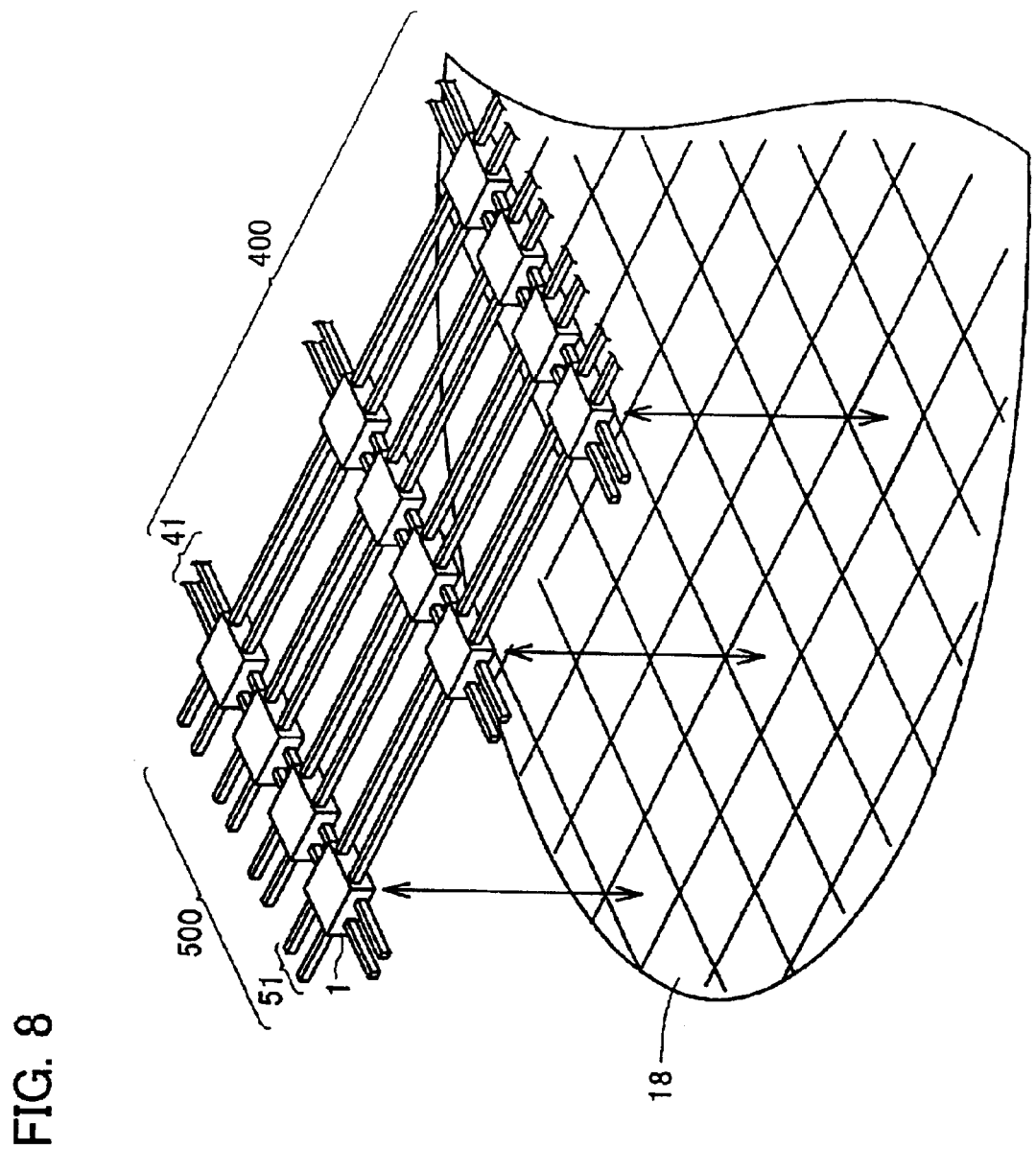
FIG. 8 is a second explanatory view illustrating the substrate testing method according to the sixth embodiment of the present invention.

Referring to FIGS. 7 and 8, a substrate testing method according to the sixth embodiment of the present invention will be described. Here, the method uses a substrate testing apparatus similar to the one described in the second embodiment. Circuit patterns of semiconductor elements are repeatedly constructed on the surface of a semiconductor wafer 18 subjected to measurement. Instead of allowing the probing needles to abut against all of these circuit patterns, one allows the probing needles to abut against every other circuit pattern as shown in FIG. 7 or against every third circuit pattern as shown in FIG. 8, by enlarging the interval between the probe units.

By adopting this method, one can test the substrate without bringing the probing needles into contact with the parts of the circuit patterns where the probing needles should not be brought into contact. This eliminates the fear of undesirably damaging the substrate with the probing needles. Since the interval of the probe units can be freely changed along the rails, one can easily accord with the change in the arrangement of the circuit patterns subjected to measurement.

Figure 9:
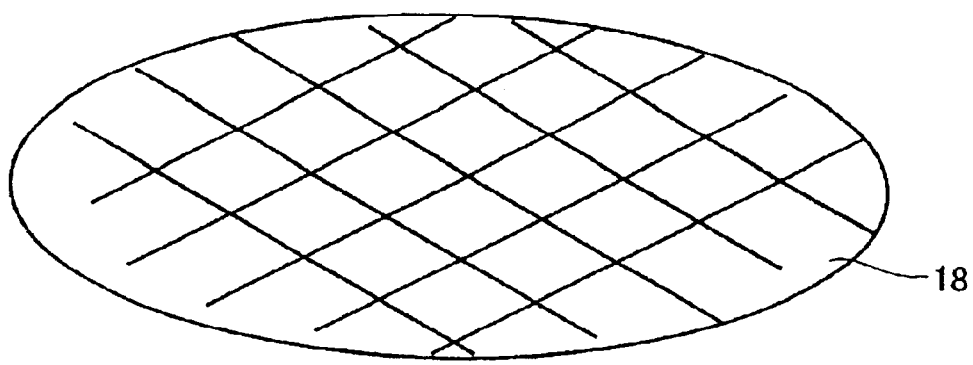
FIG. 9 is a perspective view illustrating a first example of a pattern formed on a substrate surface, which pattern is used for explanation in the sixth embodiment of the present invention.
Figure 10:
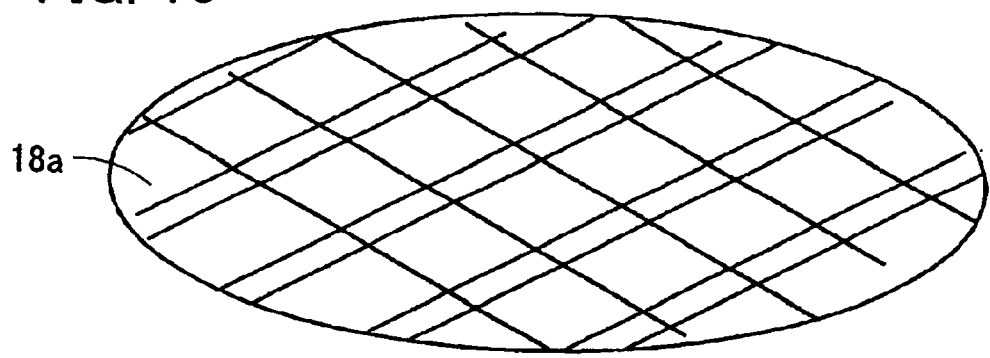
FIG. 10 is a perspective view illustrating a second example of the pattern formed on a substrate surface, which pattern is used for explanation in the sixth embodiment of the present invention.
Figure 11:
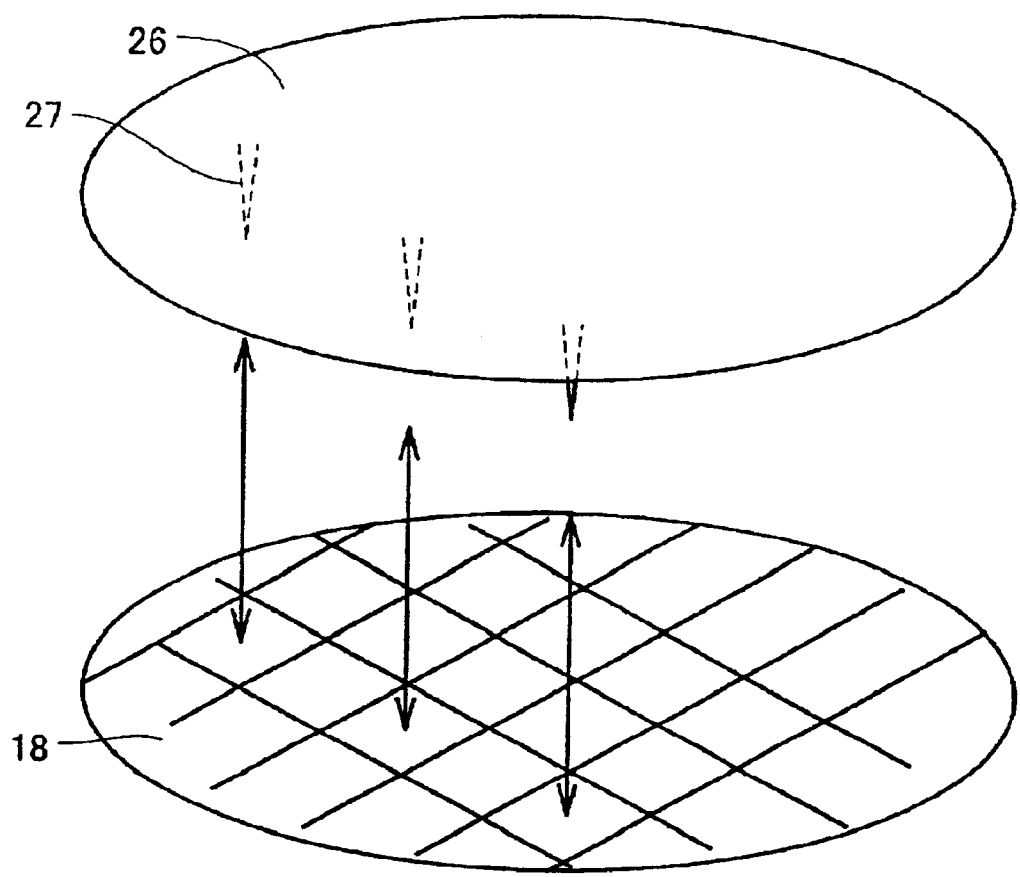
FIG. 11 is a perspective view illustrating a substrate testing apparatus according to a prior art.

Further, even if the pattern on the surface of the semiconductor wafer changes, for example, from semiconductor wafer 18 such as shown in FIG. 9 to semiconductor wafer 18a such as shown in FIG. 10, one can accord with the change simply by moving the probe units along the rails.

According to the present invention, one can suitably change the relative positional relationship of the probing needles by moving the plurality of probe units all at a time along the rails even if the measurement is to be conducted at plural sites on the substrate. Therefore, a substrate testing apparatus can be provided that can accord with the change of abutment points due to expansion/contraction of the substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate testing apparatus comprising:

a first rail group made of a plurality of rails disposed in parallel with each other;

a second rail group made of a plurality of rails disposed in parallel with each other in a direction that crosses said first rail group;

a plurality of probe units disposed to cover respective intersections of the rails included in said first rail group and the rails included in said second rail group, all of said probe units being concurrently movable along the rails included in said first rail group and said second rail group; and corresponding interval maintaining means for keeping each rail included in said first rail group at an interval corresponding to an arrangement of locations to be measured on a substrate subjected to measurement, wherein said plurality of probe units each comprise a probing needle to be brought into contact with a surface of said substrate.

2. The substrate testing apparatus according to claim 1, wherein said corresponding interval maintaining means maintains the interval after changing the interval every time the arrangement of the locations to be measured changes.

3. The substrate testing apparatus according to claim 1, wherein said corresponding interval maintaining means comprises equal interval maintaining means for keeping each rail included in said first rail group at an equal interval.

4. The substrate testing apparatus comprising:

a first rail group made of a plurality of rails disposed in parallel with each other;

a second rail group made of a plurality of rails disposed in parallel with each other in a direction that crosses said first rail group;

a plurality of probe units disposed to cover respective intersections of the rails included in said first rail group and the rails included in said second rail group, all of said probe units being concurrently movable along the rails included in said first rail group and said second rail group, wherein said plurality of probe units each comprise a probing needle to be brought into contact with a surface of said substrate;

corresponding interval maintaining means for keeping each rail included in said first rail group at an interval corresponding to an arrangement of locations to be measured on a substrate subjected to measurement, displacement measuring means for measuring a displacement of one or more observation points on the substrate subjected to measurement; and displacement measurement value feedback means for setting the interval of each rail included in said first rail group, as defined by said equal interval maintaining means, in accordance with a displacement measurement value given by said displacement measuring means, wherein said corresponding interval maintaining means comprises equal interval maintaining means for keeping each rail included in said first rail group at an equal interval.

5. A substrate testing apparatus comprising:

a first rail group made of a plurality of rails disposed in parallel with each other;

a second rail group made of plurality of rails disposed in parallel with each other in a direction that crosses said first rail group;

a plurality of probe units disposed to cover respective intersections of the rails included in said first rail group and the rails included in said second rail group, all of said probe units being concurrently movable along the rails included in said first rail group and said second rail group, wherein said plurality of probe units each comprise a probing needle to be brought into contact with a surface of said substrate;

corresponding interval maintaining means for keeping each rail included in said first rail group at an interval corresponding to an arrangement of location to be measured on a substrate subjected to measurement, temperature measuring means for measuring a temperature; and temperature measurement value feedback means for setting the interval of each rail included in said first rail group, as defined by said equal interval maintaining means, in accordance with a temperature measurement value given by said temperature measuring means, wherein said corresponding interval maintaining means comprises equal interval maintaining means for keeping each rail included in said first rail group at an equal interval.

6. A substrate testing method using a plurality of probe units disposed to cover respective intersections of rails included in a first rail group made of a plurality of rails disposed in parallel with each other and rails included in a second rail group made of a plurality of rails disposed in parallel with each other in a direction that crosses said first rail group, said plurality of probe units being movable along the rails included in said first rail group and said second rail group and each comprising a probing needle to be brought into contact with a surface of a substrate subjected to measurement, wherein said probing needles are brought into contact with said substrate in a state in which an arrangement of said plurality of probe units is concurrently adjusted so that an interval between said probing needles corresponds to an arrangement of locations to be measured on said substrate.

* * * * *

UNITED STATES PATENT AND TRADEMARK OFFICE
CERTIFICATE OF CORRECTION

PATENT NO. : 6,747,466 B2
DATED : June 8, 2004
INVENTOR(S) : Hiromitsu Sugimoto et al.

It is certified that error appears in the above-identified patent and that said Letters Patent is hereby corrected as shown below:

Column 7,
Line 52, change "The" to -- A --.

Signed and Sealed this

Eleventh Day of January, 2005

JON W. DUDAS
*Director of the United States Patent and Trademark Office*